United States Patent
Fong et al.

(10) Patent No.: US 7,679,906 B2
(45) Date of Patent: Mar. 16, 2010

(54) LIQUID RESISTANT A/C ADAPTOR

(75) Inventors: Chee K. Fong, Cupertino, CA (US);
Suet F. Tin, Redmond, WA (US);
Vinicio Manfrini, Sammamish, WA (US); J. David Egner, Sammamish, WA (US); Michael Hiett, Santa Clara, CA (US); Harjit Singh, Remond, WA (US)

(73) Assignee: Microsoft Corporation, Redmond, WA (US)

( * ) Notice: Subject to any disclaimer, the term of this patent is extended or adjusted under 35 U.S.C. 154(b) by 220 days.

(21) Appl. No.: 11/935,330

(22) Filed: Nov. 5, 2007

(65) Prior Publication Data

US 2009/0116188 A1 May 7, 2009

(51) Int. Cl.
*H05K 7/20* (2006.01)
*H05K 5/00* (2006.01)
*A47B 77/08* (2006.01)

(52) U.S. Cl. .................. 361/695; 361/679.49; 361/692; 361/694; 454/184; 312/236; 363/141; 174/547

(58) Field of Classification Search .................. 361/695, 361/696, 679.49, 679.5, 692, 694; 454/184; 312/236; 363/141; 174/522, 526, 547
See application file for complete search history.

(56) References Cited

U.S. PATENT DOCUMENTS

| | | | |
|---|---|---|---|
| 4,435,639 A | 3/1984 | Gurevich | |
| 5,502,618 A * | 3/1996 | Chiou | 361/695 |
| 5,707,757 A | 1/1998 | Lee | |
| 5,943,220 A | 8/1999 | Shikata et al. | |
| 6,081,425 A * | 6/2000 | Cheng | 361/704 |
| 6,935,894 B2 | 8/2005 | Fung | |
| 7,144,275 B2 | 12/2006 | Iida | |
| 7,247,069 B2 | 7/2007 | Porat | |
| 7,289,320 B2 * | 10/2007 | Chang et al. | 361/690 |
| 2004/0004850 A1 | 1/2004 | Frank | |
| 2006/0177089 A1 | 8/2006 | Greco et al. | |
| 2006/0255773 A1 | 11/2006 | Fong et al. | |
| 2007/0147989 A1 | 6/2007 | Collins | |
| 2007/0247817 A1 * | 10/2007 | Huang | 361/719 |

OTHER PUBLICATIONS

Thermostatic Cooling Fan for XBOX 360 htpp://www.amazon.co.uk/Thermostatic-Cooling-Fan-XBOX-360/DP/B000QV53V4#moreAboutThisProduct. Printed on Aug. 28, 2007.

* cited by examiner

*Primary Examiner*—Zachary M Pape
(74) *Attorney, Agent, or Firm*—Vierra Magen Marcus & DeNiro LLP (57) ABSTRACT

An external AC power adapter. The adapter includes a housing which, in one embodiment, defines an air inlet compartment, an air outlet compartment and a partially sealed electronics compartment containing electrical components for converting an AC input to a DC output. A blower generates an airflow within the electronics compartment for cooling the electrical components in the electronics compartment. Barriers are located in the air inlet compartment and the air outlet compartment to prevent liquid from entering the electronics compartment.

15 Claims, 5 Drawing Sheets

LIQUID RESISTANT A/C ADAPTOR

BACKGROUND

Many consumer products and other electrical devices need to convert an alternate current (AC) power input provided by electrical mains into a direct current (DC) power output that is required by the device's circuitry. An external AC power adaptor is often used for such a purpose. In addition to performing its primary function of converting an AC input into a DC output having characteristics suitable for the device's circuitry, an external AC power adaptor provides several design advantages over an internal AC power adaptor.

For example, safety concerns and/or regulations dictate that the power circuitry of an AC power adaptor be housed in an appropriately secure manner to reduce the risk of user injury. Typically, any component that can become energized with AC power needs to have a secure housing that protects against inadvertent user contact with the energized component. By moving such power circuitry outside of a device, the device itself may not need to incorporate the same level of safety features because the device only uses the DC output of the adaptor. In addition, the device may be made smaller and lighter because the size and weight of the AC power adapter, along with its housing or other safety features, is located outside of the device.

Figure 1:
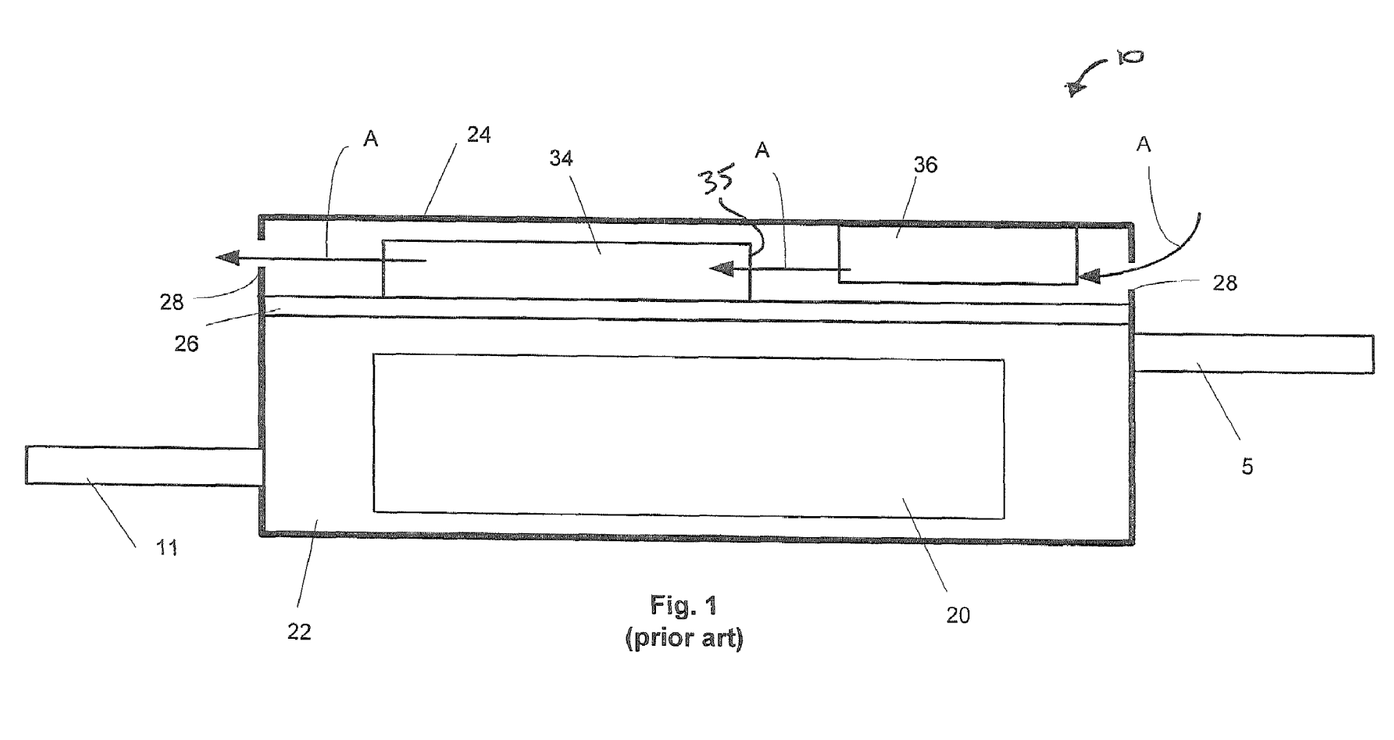
FIG. 1 depicts a diagram illustrating a cross-sectional view of an adapter, according to the prior art.

FIG. 1 illustrates a cross-sectional view of an external AC power adaptor that is configured according to the prior art. In FIG. 1, external AC power adaptor 10 receives an AC input by way of wire 5. Power circuitry 20 converts the AC input to a DC output that has characteristics (e.g., 12V, etc.) that are suitable for a device to which power is being supplied (not shown in FIG. 1 for clarity). The DC output is transmitted to a device by way of wire 11. It will be appreciated that an embodiment is equally applicable for use in connection with any type of electrical device that requires an external AC power adaptor.

It can be seen in FIG. 1 that power circuitry 20 is located within compartment 22. Compartment 22 is bounded by portions of housing 24 and heat transfer plate 26. To provide cooling for power circuitry 20, the circuitry 20 is thermally coupled to heat transfer plate 26 using a thermally-conductive adhesive or the like. Housing 24 may be formed such that one or more openings 28 may be present to allow air within compartment 32 to circulate across heat transfer plate 26 and therefore cool power circuitry 20. To provide for enhanced cooling, heat sink 34 is thermally coupled to heat transfer plate 26. In addition to, or in place of, heat sink 34, fan 36 may be located within compartment 32 to provide forced air cooling, represented in FIG. 1 by air flow A.

SUMMARY

One aspect of the present technology disclosed herein is providing direct cooling to the electrical compartment of an AC adapter housing the electronic components. In one embodiment, the adapter includes a blower located in the electronics compartment. The blower creates a forced airflow through at least a portion of the electronics compartment. The airflow travels over the various electrical components housed within the electronics compartment. In another embodiment, the adapter includes an axial fan located within the electronics compartment. The axial fan, similar to the blower, creates a forced airflow through at least a portion of the electronics compartment.

Another aspect of the present technology disclosed herein is a liquid resistant AC adapter. In one embodiment, the adapter housing defines an inlet compartment, an outlet compartment and an electronics compartment. Air enters the housing through the inlet compartment, and then travels into the electronics compartment. The air travels from the electronics compartment into the outlet compartment and subsequently exits the housing. The adapter includes barriers in the inlet compartment and the outlet compartment to prevent liquid that enters either compartment from entering the electronics compartment. In another embodiment, the inlet and outlet compartments include vent holes and drain holes such that liquid that enters a compartment may drain out of the housing and not get trapped in either compartment.

DETAILED DESCRIPTION

The technology described herein is for a liquid resistant AC power adapter. The AC adapter includes a housing that is divided into three compartments: an air input compartment, an air outlet compartment and an electronics compartment that houses electronic components for converting an AC input into a DC output. The housing is configured such that air passes through each of the three compartments, providing direct cooling of the electronic components in the electronics compartment. The adapter includes certain features that allow air, but not liquid, to enter the electronics compartment.

Figure 2:
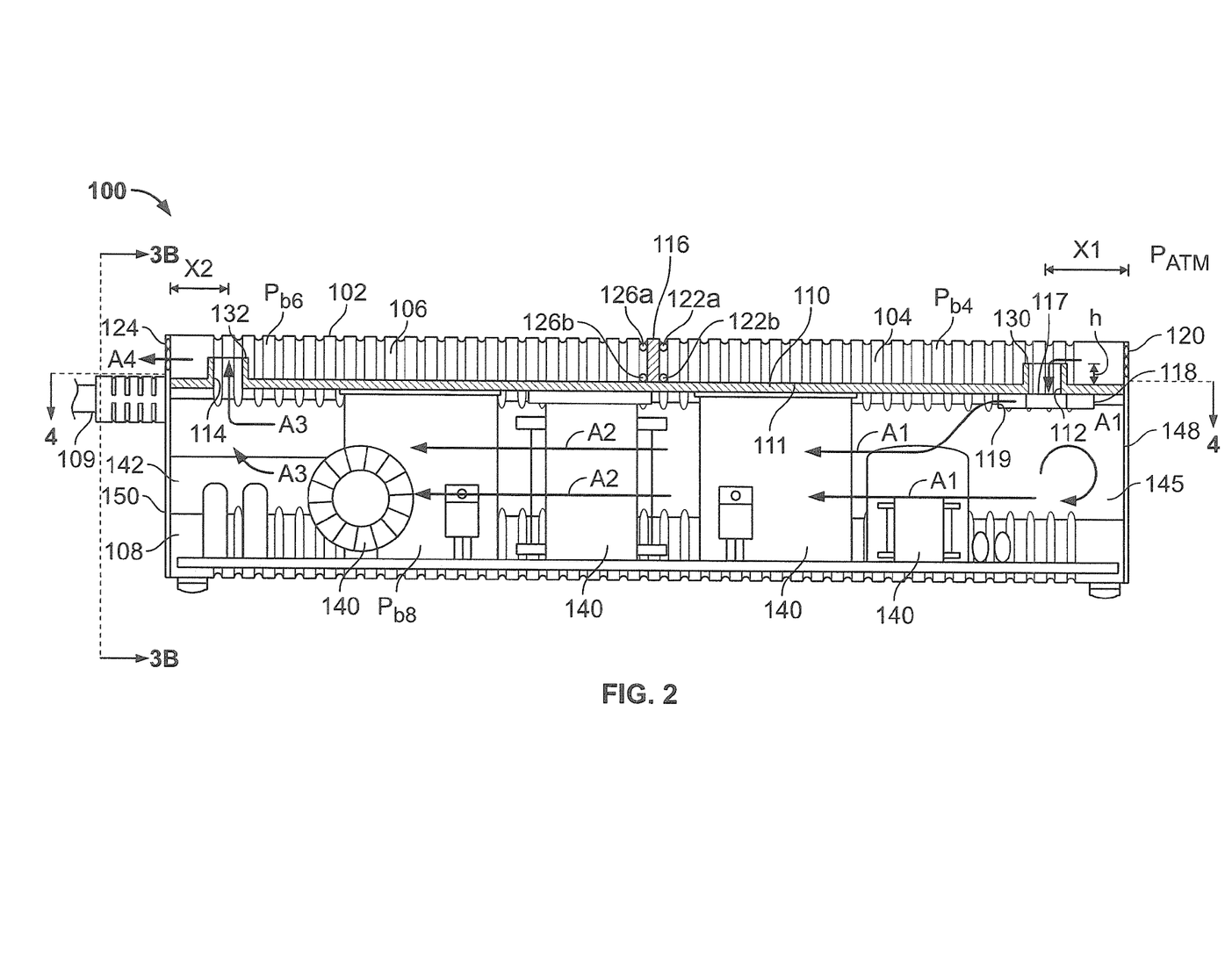
FIG. 2 depicts a partial cross-sectional view of an embodiment of a liquid resistant adapter.

FIG. 2 illustrates a cross-sectional view of an external AC power adapter that is configured according to an embodiment of the present technology. Power circuitry 140 (also referred to as "electronic components") converts the AC input to a DC output that has characteristics (e.g., 12 volts) that are suitable for a device to which power is being supplied. The DC output is transmitted to a device by way of wire 109. It will be appreciated that an embodiment is equally applicable for use in connection with any type of electrical device that requires an external AC power adapter.

The AC power adapter 100 includes a housing 102 that defines several compartments. In this embodiment, the housing 102 defines a first compartment 104, a second compartment 106 and a third compartment 108. For the purpose of describing the technology herein, the first compartment 104 is also referred to as an inlet compartment, the second compartment 106 is also referred to as an outlet compartment and the third compartment 108 is also referred to as an electronics compartment. The first compartment 102, in this embodiment, is separated from the second compartment 106 by a divider 116. The housing 102 may be comprised of any material that is suitable for housing electrical components. By way of example only, it will be appreciated that plastic is commonly used in such applications because of its physical strength and low cost.

The third compartment 108 is partially sealed from the first compartment 104 and the second compartment 106 by a platform 110. The platform 110, in this embodiment, includes a first passage 112 and a second passage 114. The first passage 112 provides a connection between the inlet compartment 104 and the electronics compartment 108. The second passage 114 provides a connection between the outlet compartment 106 and the electronics compartment 108.

Figures 3A, 3B, 4:
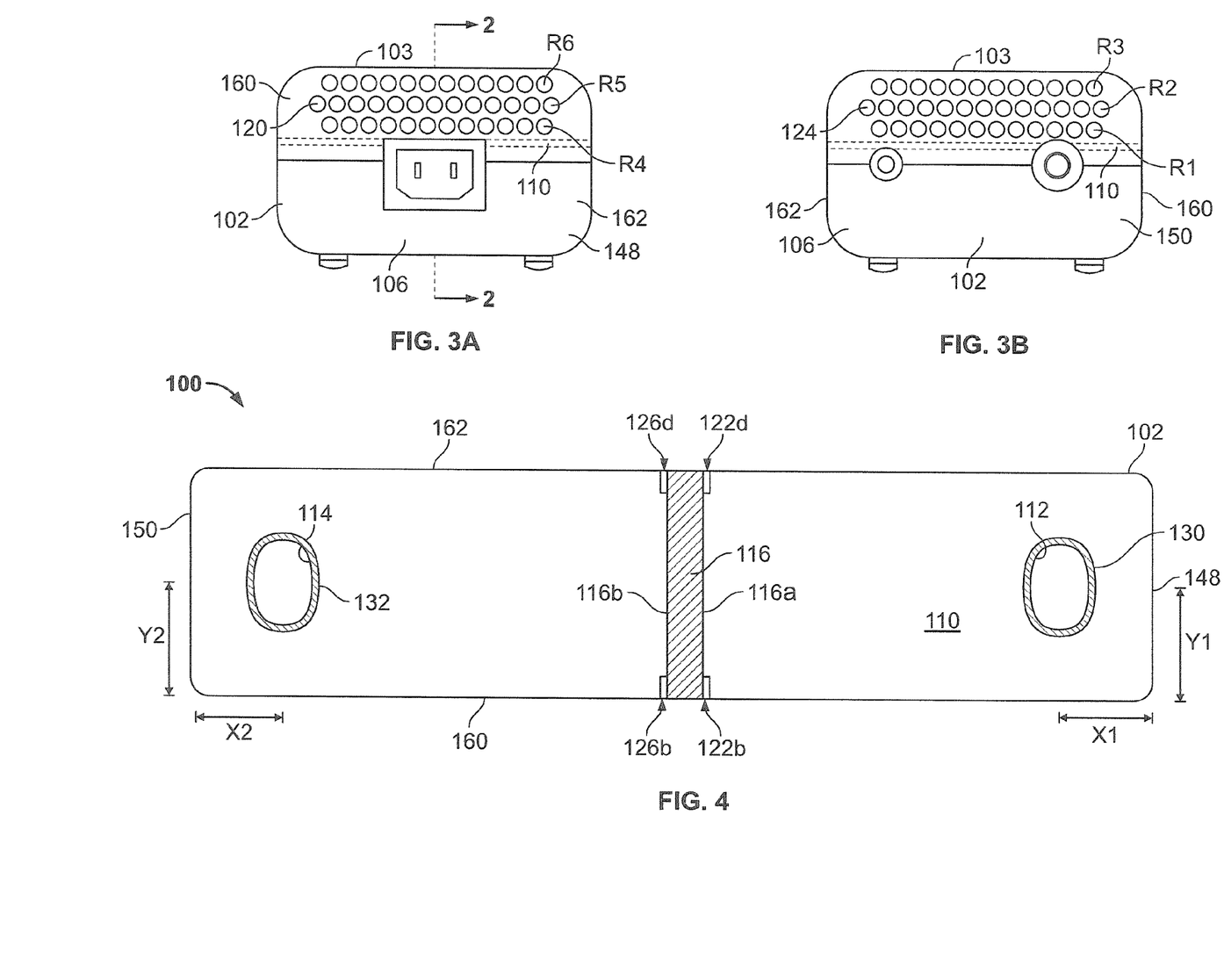
FIGS. 3A-3B depict end views of the liquid resistant adapter shown in FIG. 2.
FIG. 4 depicts a representative plan view of the liquid resistant adapter shown in FIG. 2.

The housing 102 includes vent holes 120 that allows air to enter the inlet compartment 104. FIG. 2 illustrates that air may enter the housing 102 through the vent holes 120 into the inlet compartment 104. The housing also includes vent holes 124 so that air within the outlet compartment 106 may exit the housing 102. FIG. 2 illustrates the air flow exiting the housing 102 as airflow path A4. FIGS. 3A-3B illustrate an exemplary embodiment of the vent holes 120 and 124 in the housing 102. The housing 102 may have any other configuration of vent holes 120 and 124. Similarly, the housing 102 is not required to have more than one vent hole 120 or one vent hole 124.

The first passage 112 and the second passage 114 may be located anywhere along the platform 110. FIG. 2 illustrates that the first passage 112 is located a distance X1 from the end 148 of the housing 102. FIG. 2 illustrates that the second passage 114 is located a distance X2 from the end 150 of the housing 102. The distances X1 and X2 may comprise any distance and may be the same distance or different distances. As will be discussed in more detail later, the first passage 112 is preferably a minimum distance from the vent holes 120 to prevent any liquid that enters the inlet compartment 104 from entering directly into the electronics compartment 108. Similarly, the second passage 114 is preferably a minimum distance from the vent holes 124 to prevent any liquid that enters the outlet compartment 106 from entering directly into the electronics compartment 108.

To provide cooling for power circuitry 140, the housing 102 includes a blower 118. FIG. 2 illustrates that the blower 118 is located in the electronics compartment 108. The blower 118 is preferably a centrifugal fan having an inlet 117 and an outlet 119. A centrifugal fan is preferred because it produces more pressure for a given air volume than a conventional axial fan. Centrifugal fans blow air at right angles to the inlet 117 of the fan, and spin the air outwards to the outlet 119. Of course, the blower 118 may also comprise other types of fans such as an axial fan (see, for example, FIG. 4).

The impeller in the blower 118 rotates, causing air to enter the inlet 117 through the first passage 112 and move perpendicularly to the outlet 119. The airflow path A shown in FIG. 2 initially travels into the inlet compartment 104 through the vent holes 120. Air traveling over the barrier 130 will be pulled into the barrier 130 and into the blower intake 117 through the first passage 112. The blower 118 blows air out the outlet 119 into the electronics compartment 108. Regardless of the position of the blower 118, the blower 118 blows air through at least a portion of the electronics compartment 108 (shown as airflow path A).

FIG. 2 illustrates that a direct airflow travels over many of the electronic components 140. While a direct airflow is created through much of the electronics compartment 108, the ends 142 and 145 of the electronics compartment 108 are likely to have a circulating airflow. The direct airflow (indicated by airflow paths A1, A2 and A3) provides more efficient cooling of the electronic components 140 than the circulating air (indicated by the airflow path A'). In FIG. 2, the direct airflow path within the electronics compartment 108 is shown as an initial airflow path A1, an intermediate path A2 and an exiting path A3.

The electronic components 140 generate heat while in operation. Thus, while the adapter 100 is operating, the temperature within the electronics compartment 108 is hotter than the temperature in either the inlet compartment 104 or the outlet compartment 106. The blower 118 blows continuous cool air into the electronics compartment 108. The circulating air will eventually exit the electronics compartment 108 through the second passage 114. However, while the air is circulating within the electronics compartment 108, the circulating air is heated up. Thus, electronic components 140 within the path of the direct airflow are cooled down faster than an electronic component 140 that is located in an area with circulating air.

The adapter 100 provides several advantages over the adapter 10 shown in FIG. 1. Without direct cooling of the electrical components harder to dissipate the heat generated by the components, the case temperature of the adapter 10 is much hotter than the temperature of the housing 102 of the adapter 100. The direct cooling provided by the blower 118 allows the electronic components 140 to run at a hotter temperature than the components 20 in the adapter 10. Thus, the electronic components 140 may be de-rated compared to the more expensive, higher efficiency components in the adapter 10. The components 20 in the adapter 10 need to comprise, for example, use lesser heat generating components such as a lower "on resistance" MOSFET, bigger chokes and a lower loss Transformer. The ability to de-rate the components 140 in the adapter 100 reduces the cost of the components (e.g., less efficient components which dissipate more heat are less expensive than the components required to be used in the adapter 10). In addition, if the adapters 100 and 10 have a similar power rating, the adapter 100 will be physically smaller than the adapter 10. The adapter 10 requires a larger outer surface area to dissipate the heat generated by the components 20.

In addition to the forced airflow created by the blower 118, the differential pressure between each compartment assists the air flow through the housing. Air will enter the inlet compartment 104 because the atmospheric pressure ($P_{atm}$) outside of the adapter 100 is greater than the air pressure within the inlet compartment 104 ($P_{104}$). The air pressure within the electronics compartment 106 ($P_{106}$) is greater than the air pressure within the outlet compartment 108 ($P_{108}$). Thus, when the air reaches the distal end 142 of the electronics compartment 106, the air will travel through the second passage 114 and into the outlet compartment 108. The air pressure within the outlet compartment 108 ($P_{108}$) is greater than the atmospheric pressure ($P_{atm}$) outside of the adapter 100. Accordingly, air within the outlet compartment 108 will exit outside the housing 102 through the outlet vents 124.

As may be appreciated, having the first passage 112 and the second passage 114 could compromise the safety of the AC adapter 100 if proper precautions are not taken. FIG. 2 illustrates that a barrier 130 prevents liquid from entering the first passage 112 and a barrier 132 prevents liquid from entering the second passage 114. As will be discussed in more detail later, these barriers 130 and 132 are configured to prevent liquid from entering the electronics compartment 106, which would damage the electrical components 140.

The size of the blower 118 directly affects the airflow rate generated within the electronics compartment 108. There is no ideal airflow rate within the electronics compartment 108. The adapter 100 generally removes heat directly from the electronic components 140 by blowing air directly over the electrical components 140. By reducing the heat in the electronics compartment 108 with the direct airflow over the electrical components 140, the electrical components are allowed to run hotter than if the electrical components were located in a sealed lower compartment (e.g., lower compartment 20 shown in FIG. 1). The direct cooling of the electrical components 140 allows the adapter 100 to use electrical components that have been degraded in comparison to the electrical components 20 used by the adapter 10. In addition, the heat sink 34 required by the adapter 10 is no longer needed.

Placing the blower 118 within the electronics compartment 108 also creates a quieter adapter 100 than the adapter 10 shown in FIG. 1. The fan 36 in the adapter 10 blows air directly at the heat sink 34, which is located nearby the fan 36 has a relatively flat face 35 facing the fan 36. The forced air exiting the fan 36 strikes the face 35 at a high velocity and creates a noise. In contrast, the forced air exiting the blower 118 is blown into a larger volume compartment (electronics compartment 108). Accordingly, the air blown out of the blower 118 immediately begins to slow down once it exits the blower 118, and strikes each electronic component at a slower velocity. Thus, the adapter 100 is quieter than the conventional adapter 10.

The first passage 112 and the second passage 114 may comprise any diameter and/or shape. The shape and size of the first passage 112 does affect the airflow rate that can be achieved in the electronics compartment 108. For example, the diameter of the first passage 112 affects the intake of the blower 118. And the diameter of the second passage 114 affects the maximum airflow rate through the second passage 114.

The first passage 112 and the second passage 114 may be located any distance from the vent holes 120 and vent holes 124. However, the first passage 112 and the second passage 114 are preferably not adjacent to the vent holes 120 or the vent holes 124. Otherwise, liquid that enters the housing 102 through the vent holes 120 may directly enter into the first passage 112. Similarly, liquid that enters the housing 102 through the vent holes 124 may directly enter into the second passage 114. In one embodiment, the first passage 112 and the second passage 114 are located distance X1 and X2 from the vent holes 120 and the vent holes 124, respectively. Locating the first passage 112 (and thus the barrier 130) away from the vent holes 120 allows liquid that enters the inlet compartment 104 through the vent hole 120 to spill onto the platform 110 before the liquid reaches the barrier 130. Similarly, locating the second passage 114 (and thus the barrier 132) away from the vent holes 124 allows liquid that enters the outlet compartment 106 through the vent hole 124 to spill onto the platform 110 before the liquid reaches the barrier 132.

FIG. 2 illustrates that the barriers 130 and 132 have a height h. The barriers 130 and 132, in this embodiment, have a circular cross-section and have a chimney-like shape. The barriers 130 and 132 may comprise other shapes. By way of example only, the barriers 130 and 132 may comprise a square cross-section or an oval cross-section. The height h of the barriers 130 and 132 are not required to be equal and may comprise any height. In one embodiment, the height h of each of the barriers 130 and 132 is one-half the height H of the inlet compartment 104 and the outlet compartment 106, respectively. Without any barrier, liquid entering the inlet compartment 104 would enter the first passage 112 and the blower 118 would blow liquid onto the electronic components 140—damaging the adapter 100. Similarly, liquid entering the outlet compartment 106 would enter the second passage 114 and damage the electronic components 140. With the barriers 130 and 132, liquid may enter the inlet compartment 104 and the outlet compartment 106, up to the height h of the barriers, without entering the first passage 112 or the second passage 114.

The housing 102 contains several features for draining liquid that enters either the inlet compartment 104 or the outlet compartment 106. For example, the inlet compartment 104 includes side holes 122a and 122b in the first side wall 160 of the housing 102 and side holes 122c and 122d in the second side wall 162 of the housing 102. In one embodiment, side holes 122a and 122c are located at an elevation substantially equal to the elevation of top surface 111 of the platform 110 and the side holes 122b and 122d are located at an elevation substantially equal to the top surface 103 of the housing 102. The outlet compartment 106 includes side holes 126a and 126b in the first side wall 160 of the housing 102 and side holes 126c and 126d in the second side wall 162 of the housing 102. In one embodiment, side holes 126a and 126c are located at an elevation substantially equal to the elevation of top surface 111 of the platform 110 and the side holes 126b and 126d are located at an elevation substantially equal to the top surface 103 of the housing 102.

The location of the side holes 122 and 126, in combination with the vent holes 120 and 124, create a housing 102 that can drain liquid regardless of how the housing 102 is positioned. For example, if the adapter 100 is set on the floor as shown in FIG. 2, and liquid enters the inlet compartment 104, the liquid will exit the housing 102 through either the drain holes 122b or 122d or through the vent holes 120. If the adapter 100 is set on the floor upside down (rotate adapter 100 shown in FIG. 2 180 degrees), liquid that enters the inlet compartment 104 will drain out of the housing 102 through either the drain holes 122a or 122c or through the vent holes 120. The drain holes 126 in the outlet compartment 106 provide the same drain features. In other words, no matter how the adapter 100 is positioned, a drain hole or a vent hole will be located at the lowest elevation and the liquid will drain out of the housing 102.

Even if the adapter 100 is set against an object at a forty-five degree angle on, for example, the floor, either the vent holes or the drain holes will allow the liquid to drain out of the housing 102. For example, suppose the adapter 100 is seated on the floor such that the first end 148 of the adapter 100 is higher than the second end 150 of the adapter 100 (e.g., rotate the adapter 100 shown in FIG. 2 45° degrees counterclockwise). And suppose a bottle of water is spilled on the adapter 100. Any water that enters the inlet compartment 104 through either the vent holes 120 or the drain holes 122 will travel along the platform 110 towards the divider 116 and drain out of the side holes 122b and 122d. Any water that enters the outlet compartment 106 through either the vent holes 124 or the drain holes 126 will travel along the platform 110 away from the divider 116 and drain out of the vent holes 124.

As discussed above, the barriers 130 and 132 may comprise any height h. However, it is preferable that the distal ends of the barriers 130 and 132 are not too close to the housing 102. In the case where the adapter 100 is placed upside down on an object (rotate the adapter shown in FIG. 2 180°), is it preferable that any liquid entering the inlet compartment 104 and/or the outlet compartment 106 travel along the housing 102 (which comprise the floor on the compartments in this configuration) and under the barriers 130 and 132. In order to prevent liquid from being sucked into the barriers 130 and 132, an air gap will exist between the liquid and the distal end of each barrier. This air gap also allows air to travel into the inlet compartment 104, through the barrier 130 and into the blower intake to maintain the airflow within the electronics compartment 108. The air gap between the liquid and the distal end of the barrier 132 allows the airflow within the electronics compartment 108 to exit the housing 102 through the outlet compartment 106. In one embodiment, the height h of the barrier 130 is one-half the height H of the inlet compartment 104. However, the barrier 130 may comprise any height. The barrier 132, in FIG. 2, is shown identical to the barrier 130. This is not a requirement. The height h of the barrier 132 may comprise any height and the outlet compartment 106 may include more than one outlet hole 114 with a protective barrier 132.

FIGS. 3A-3B illustrate the vent holes 120 and 124. FIG. 3A shows that the first end 148 of the housing 102 includes multiple vent holes 120. The housing 102 may have any number of vent holes 120, and the vent holes 120 do not have to be configured as shown in FIG. 3A. Here, the first end 148 of the housing 102 includes three rows of vent holes 120: a first row R1, a second row R2 and a third row R3. When the adapter 100 is seated on the floor (or any other object) in the position shown in FIG. 3A, a low level of liquid within the inlet compartment 104 will drain out of the vent holes 120 in at least row R1. Higher levels of liquid within the inlet compartment 104 will also drain out of the vent holes 120 in rows R2 and R3, depending on the level of the liquid. When the adapter 100 is seated on the floor (or any other object) in an upside down position (e.g., rotate the adapter shown FIG. 3A ninety degrees), a low level of liquid within the inlet compartment 104 will drain out of the vent holes 120 in at least row R3. Higher levels of liquid within the inlet compartment 104 will also drain out of the vent holes 120 in rows R2 and R1, depending on the level of the liquid. Of course, the liquid will also drain out of the inlet compartment 104 through the drain holes 122.

FIG. 3B shows that the second end 150 of the housing 102 includes multiple vent holes 124. The housing 102 may have any number of vent holes 124, and the vent holes 124 do not have to be configured as shown in FIG. 3B. Here, the second end 150 of the housing 102 includes three rows of vent holes 124: a first row R4, a second row R5 and a third row R6. When the adapter 100 is seated on the floor (or any other object) in the position shown in FIG. 3B, a low level of liquid within the outlet compartment 106 will drain out of the vent holes 124 in at least row R4. Higher levels of liquid within the outlet compartment 106 will also drain out of the vent holes 124 in rows R5 and R6, depending on the level of the liquid. When the adapter 100 is seated on the floor (or any other object) in an upside down position (e.g., rotate the adapter shown FIG. 3B ninety degrees), a low level of liquid within the outlet compartment 106 will drain out of the vent holes 124 in at least row R6. Higher levels of liquid within the outlet compartment 106 will also drain out of the vent holes 124 in rows r5 and r4, depending on the level of the liquid. Of course, the liquid will also drain out of the outlet compartment 106 through the drain holes 126.

Figure 5:
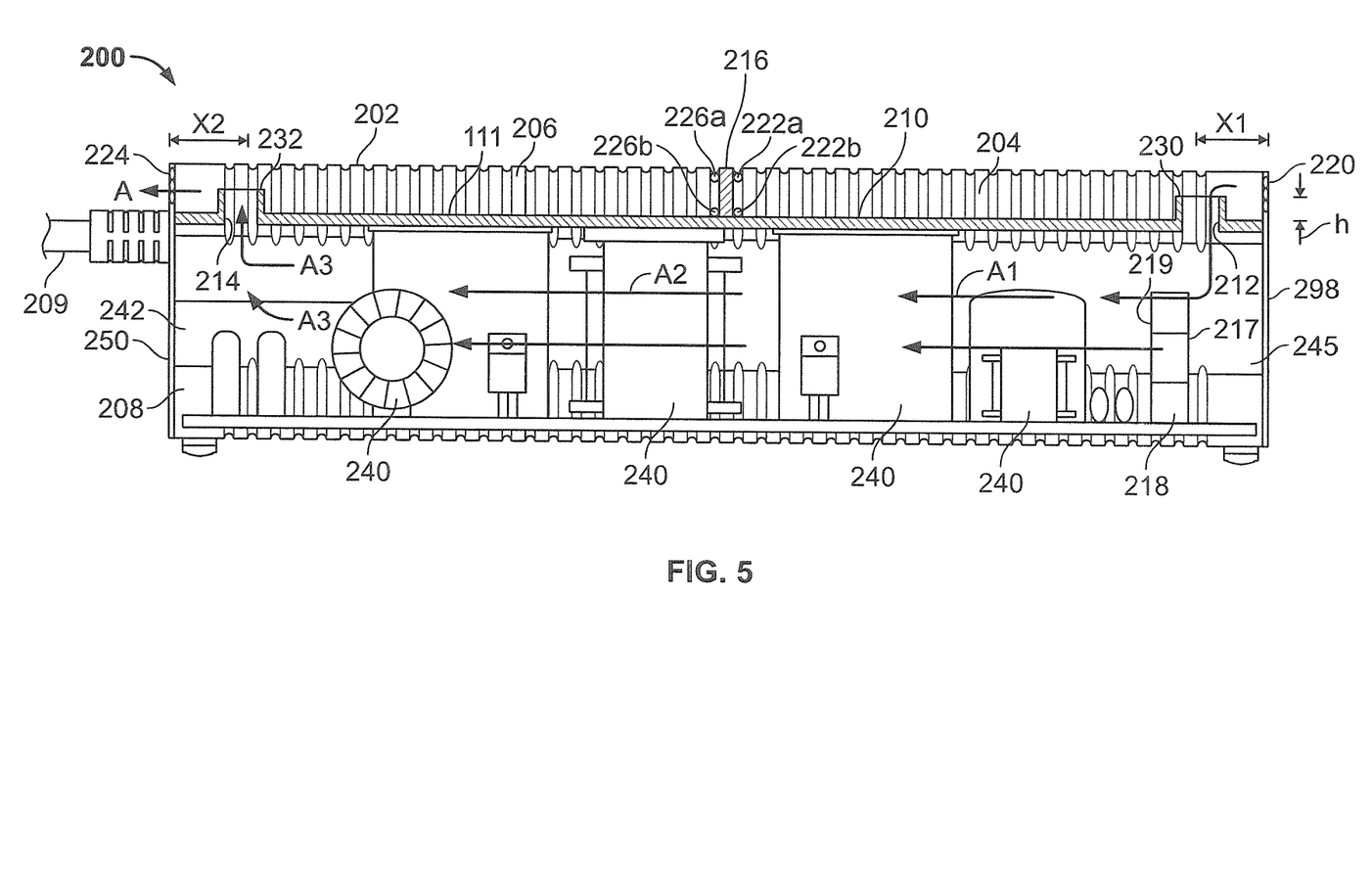
FIG. 5 depicts a partial cross-sectional view of another embodiment of a liquid resistant adapter.

FIG. 5 illustrates an adapter 200. Many of the components of the adapter 200 are similar to the adapter 100 shown in FIG. 2. The adapter 200 includes a housing 202 defining an inlet compartment 204, an outlet compartment 206 and an electronics compartment 208. The electronics compartment is partially sealed from both the inlet compartment 204 and the outlet compartment 206 by platform 210. Air travels between the electronics compartment 208 and the inlet compartment 204 through the first passage 212. Air travels between the electronics compartment 208 and the outlet compartment 206 through the second passage 214.

The inlet compartment 204 and the outlet compartment 206 both contain drain holes and a vent hole. The inlet compartment 204 includes drain holes 222 and a vent hole 220. The outlet compartment 206 includes drain holes 226 and vent holes 224. FIG. 5 illustrates that the drain holes and vent holes in the housing 202 are in the same locations as the drain holes and vent holes in the housing 102 shown in FIG. 2. As described above, the vent holes and drain holes may be positioned in other locations. The housing 202 may also have additional or fewer drain holes and vent holes than that shown in FIG. 5. The adapter 200 includes a barrier 230 to prevent liquid from entering the electronics compartment 208 through the first passage 212. The adapter 200 also includes a barrier 232 to prevent liquid from entering the electronics compartment 208 through the second passage 214.

The first passage 212 is offset from the vent holes 220 by a distance X1. The second passage 214 is offset from the vent holes 224 by a distance X2. Similar to the adapter 100, the first passage 212 is preferably not located adjacent the vent holes 220 to prevent any liquid that enters the inlet compartment 204 from splashing over the barrier 230. The second passage 212 is also preferably not located adjacent the vent holes 224 to prevent any liquid that enters the outlet compartment 206 from splashing over the barrier 232. It is preferable for liquid entering either the inlet or outlet compartment to initially hit the platform 110. The liquid must then rise above the height h of the barrier until the liquid can travel over the barrier and enter the electronics compartment 208. The drain holes and vent holes prevent the liquid level in either compartment (inlet or outlet) from spilling over the barrier.

In the FIG. 5 embodiment, a fan 218, instead of a blower, generates the direct airflow through the electronics compartment 208. FIG. 5 illustrates that the fan 218, similar to the blower 118, is located in the electronics compartment 208. The fan 218 has an inlet 217 and an outlet 219. FIG. 5 illustrates that the fan 218 comprises an axial fan. The housing 202 may include other types of fans to generate the airflow within the electronics compartment 208.

Figure 6:
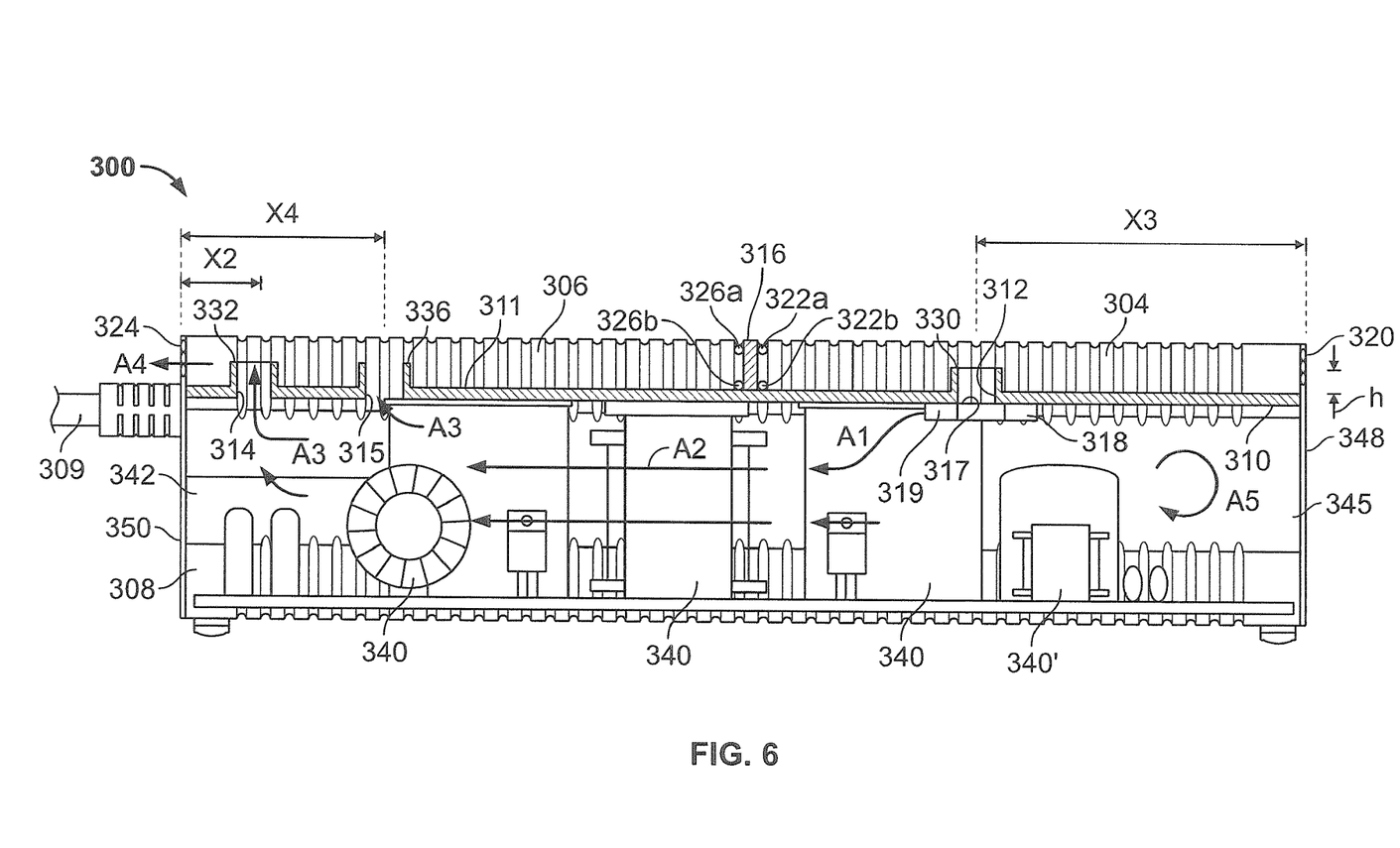
FIG. 6 depicts a partial cross-sectional view of another embodiment of a liquid resistant adapter.

FIG. 6 illustrates an adapter 300. The adapter 300 includes many of the same elements as the adapter 100. However, the adapter 300 in the FIG. 6 contains several different features than previously discussed above. The adapter 300 includes a first passage 312 between the inlet compartment 304 and the electronics compartment 308 that is located closer to the divider 316 than previously shown. A barrier 330 prevents liquid from entering the electronics compartment 308 through the first passage 312. In addition, the adapter 300 includes two passages between the outlet compartment 306 and the electronics compartment 308: a second passage 314 and a third passage 315. FIG. 6 illustrates that the third passage 315 is located a distance X3 from the vent holes 324. The distance X3 may comprise any distance. A barrier 332 prevents liquid from entering the electronics compartment 308 through the second passage 314. A barrier 336 prevents liquid from entering the electronics compartment 308 through the third passage 315.

The first passage 312 may be any distance from the end 348 of the housing 302. FIG. 6 illustrates that, in this embodiment, the first passage 312 is located a distance X3 from the vent holes 320. The first passage 312 functions as the inlet for the blower 318. Thus, moving the first passage 312 further away from the vent holes 320 also moves the position of the blower 318. Accordingly, the blower 318 will generate a forced airflow through a smaller portion of the electronics compartment 308 than the embodiments discussed above. Moving the position of the blower 318 also increases the amount of circulating airflow within the electronics compartment 308.

In FIG. 6, the largest circulating airflow area in the electronics compartment 308 is located between the blower 318 and the end 348 of the housing 302 (designated as area 345). In the FIG. 6 embodiment, the electrical component 340 will not be cooled by the forced airflow generated by the blower 318. As discussed above, the circulating airflow does not provide the same amount of cooling that the forced airflow (shown as airflow path A) provides. While the adapter 300 may not provide the cooling efficiency of the prior embodiments, the adapter 300 may be less susceptible to liquid entering the electronic compartment 308 because the first passage 312 is further from the vent holes 320.

FIG. 4 displays an exemplary cross-sectional plan view of the adapter 100. In this embodiment, both the inlet hole 112 and the outlet hole 114 are centered between the first side 160 and second side 162 of the housing 102. The center of the inlet hole 112 is shown as a distance Y1 from the first side 160 and a distance X1 from the first end 148. Similarly, the center of the outlet hole 114 is shown as a distance Y2 from the second side 162 and a distance X2 from the second end 150. The inlet hole 112 and outlet hole 114 do not have to be located in similar positions (e.g., X1 does not have to be equal to X2 and Y1 does not have to be equal to Y2). In other words, the inlet hole 112 and outlet hole 114 maybe located anywhere within the first compartment 104 and second compartment 106, respectively. The FIG. 4 embodiment shows an oval shaped inlet hole 112 and outlet hole 114. The inlet and outlet holes 112 and 114 may have other shapes (e.g., square, rectangular, circular, etc.) and may each comprise a different shape (e.g., inlet hole 112 is oval and outlet hole 114 is circular).

FIG. 4 also illustrates the barriers 130 and 132, the divider 116 and the side holes 122 and 126. The divider 116 preferably extends the width of the housing 102 to isolate the first compartment 104 from the second compartment 106. By extending the width of the housing 102 (and the height of the first and second compartment), the divider 116 comprises the back wall of the first and second compartments. The divider 116 is not required to extend the width of the housing 102 or extend the entire height of the first or second compartment. FIG. 4 shows that the first wall 116A of the divider 116 comprises the back wall of the first compartment 104 and the second wall 116B of the divider 116 comprises the back wall of the second compartment 106. As discussed above, if liquid enters the first compartment 104 or the second compartment 106, and the adapter 100 is not level, the liquid will travel along the platform 110 until it contacts the divider 116 and will exit the housing 102 through the side hole 122 and 126.

The subject matter of the present technology is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies. In addition, it is assumed that one skilled in the art is familiar with details pertaining to external AC power adaptor wiring, circuitry and construction, and so such details are omitted herein for purposes of clarity.

While the present technology has been described in connection with the embodiments of the various figures, it is to be understood that other similar embodiments may be used or modifications and additions may be made to the described embodiment for performing the same function of the present technology without deviating therefrom. Therefore, the present technology should not be limited to any single embodiment, but rather should be construed in breadth and scope in accordance with the appended claims.

We claim:

1. An external AC power adapter, comprising: a housing defining a first compartment and a second compartment separated from a third compartment by a platform, wherein the platform includes a first passage providing a first airway between the first compartment and the third compartment and a second passage providing a second airway between the second compartment and the third compartment, the third compartment containing electrical components for converting an AC input to a DC output; a first barrier extending upward from the platform for preventing liquid that enters the first compartment from traveling through the first airway into the third compartment, the first barrier having a circular cross section; a second barrier extending upward from the platform for preventing liquid that enters the second compartment from traveling through the second airway into the third compartment, the second barrier having a circular cross section; and a blower for generating an air flow within the third compartment; wherein the first compartment includes a first side wall, a second side wall, a first end wall, and a second end wall, the first end wall is a divider between the first compartment and the second compartment; the first and second side walls each contain at least one drain hole proximate the first wall; and the second end wall contains at least one air inlet vent hole.

2. The adapter as recited in claim 1, wherein the blower is located within the third compartment.

3. The adapter as recited in claim 1, wherein:
the second compartment includes a first side wall, a second side wall, a first end wall and a second end wall, the first end wall is a divider between the first compartment and the second compartment;
the first and second side walls each contain at least one drain hole proximate to the first end wall; and
the second end wall contains at least one air outlet vent hole.

4. The adapter as recited in claim 3, wherein the first barrier extends upward from the platform to a height equivalent to at least one-half the height of the first compartment.

5. The adapter as recited in claim 4, wherein second barrier extends upward from the platform to a height equivalent to at least one-half the height of the second compartment.

6. The adapter as recited in claim 5, wherein the first barrier is spaced away from the second end wall in the first compartment and the second barrier is spaced away from the second end wall in the second compartment.

7. The adapter as recited in claim 1, wherein the airflow within the third compartment travels directly over the electronic components for converting an AC input to a DC output.

8. The adapter as recited in claim 1, wherein the at least one drain hole allows liquid that enters the first compartment to drain out of the first compartment.

9. An external AC power adapter, comprising: a housing defining an air input compartment, an air outlet compartment and a partially sealed electronics compartment containing electrical components for converting an AC input to a DC output, the air inlet compartment and air outlet compartment separated from the electronics compartment by a platform having a first air passage and a second air passage; a first liquid barrier in the air input compartment preventing liquid that enters the air input compartment from entering the partially sealed electronics compartment through the first passage, the first liquid barrier extending upward from the platform and having a circular cross section; a second liquid barrier in the air outlet compartment preventing liquid that enters the air outlet compartment from entering the partially sealed electronics compartment through the second passage, the second liquid barrier extending upward from the platform and having a circular cross section; and a blower configured to generate an airflow within the electronics compartment; wherein the air inlet compartment is separated from the air outlet compartment by a divider and the air inlet compartment and air outlet compartment each have at least one drain hole proximate to the divider.

10. The adapter as recited in claim 9, wherein the blower is located within the electronics compartment.

11. The adapter as recited in claim 9, wherein the second liquid barrier extends upward from the platform to a height equivalent to at least one-half the height of the air outlet compartment.

12. The adapter as recited in claim 11, wherein the first liquid barrier extends upward from the platform to a height equivalent to at least one-half the height of the air inlet compartment.

13. An external AC adapter housing, comprising: an air inlet compartment having a first set of air inlet vent holes in a first end of the housing; an air outlet compartment isolated from the air inlet compartment by a divider, the air outlet compartment having a second set of air outlet vent holes in a second end of the housing; an electronics compartment storing electronic components for converting AC input to DC output, wherein the air inlet compartment is in fluid communication with the electronics compartment through a first passage in a platform and the air outlet compartment is in fluid communication with the electronics compartment through a second passage in the platform; a first barrier extending upward from the platform in the air inlet compartment for preventing liquid that enters the air inlet compartment from entering the electronics compartment through the first passage, the first barrier having a circular cross section and spaced away from the first end of the housing; and a second barrier extending upward from the platform in the air outlet compartment for preventing liquid that enters the air outlet compartment from entering the electronics compartment through the second passage, the second barrier having a circular cross section and spaced away from the second end of the housing.

14. The adapter as recited in claim 13, further including:
a blower, located in the electronics compartment, for generating an airflow within the electronics compartment.

15. The adapter as recited in claim 13, further comprising:
at least one drain hole in the air inlet compartment and the air outlet compartment allowing liquid that enters the air inlet compartment and the air outlet compartment to exit the housing.

* * * * *

UNITED STATES PATENT AND TRADEMARK OFFICE
CERTIFICATE OF CORRECTION

| | | |
|---|---|---|
| PATENT NO. | : 7,679,906 B2 | Page 1 of 1 |
| APPLICATION NO. | : 11/935330 | |
| DATED | : March 16, 2010 | |
| INVENTOR(S) | : Chee K. Fong et al. | |

It is certified that error appears in the above-identified patent and that said Letters Patent is hereby corrected as shown below:

In column 9, line 9, delete "Xl" and insert -- X1 --, therefor.

In column 9, line 13, delete "Xl" and insert -- X1 --, therefor.

Signed and Sealed this

Seventeenth Day of May, 2011

David J. Kappos
*Director of the United States Patent and Trademark Office*